United States Patent
Sakurai

(10) Patent No.: US 12,476,599 B2
(45) Date of Patent: Nov. 18, 2025

(54) TEMPERATURE TOLERANT INPUT STAGES FOR CIRCUITS

(71) Applicant: TEXAS INSTRUMENTS INCORPORATED, Dallas, TX (US)

(72) Inventor: Satoshi Sakurai, San Carlos, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 683 days.

(21) Appl. No.: 17/731,730

(22) Filed: Apr. 28, 2022

(65) Prior Publication Data
US 2023/0353107 A1     Nov. 2, 2023

(51) Int. Cl.
H03F 3/45     (2006.01)
H03K 3/0233     (2006.01)

(52) U.S. Cl.
CPC ........ H03F 3/45273 (2013.01); H03K 3/0233 (2013.01)

(58) Field of Classification Search
CPC .......... H03F 3/45273; H03F 2200/219; H03F 2200/291; H03F 2200/75; H03F 2203/45362; H03F 3/45183; H03F 3/505; H03F 1/301; H03F 3/45179; H03F 2203/45286; H03K 3/0233; H03K 5/2481

USPC ......................................................... 330/110
See application file for complete search history.

(56) References Cited

U.S. PATENT DOCUMENTS

2002/0075074 A1*   6/2002   Wang .................. H03F 3/45183
                                                                                            330/253

* cited by examiner

Primary Examiner — Andrea Lindgren Baltzell
Assistant Examiner — Khiem D Nguyen
(74) Attorney, Agent, or Firm — Mandy Barsilai Fernandez; Frank D. Cimino

(57) ABSTRACT

Examples of input stages of circuits are configured to reduce both negative-bias temperature instability (NBTI) and positive-bias temperature instability (PBTI) in PMOS transistors therein. Current-switched PMOS source follower transistors and a low-side NMOS differential pair is used to process a lower range of a rail-to-rail input signal range of a circuit. A PMOS source follower is disposed between the positive input of the circuit and the positive input of the low-side NMOS differential pair. Another PMOS source follower is disposed between the negative input of the circuit and the negative input of the low-side NMOS differential pair. Various arrangements are provided for generating and maintaining the bias currents of the two PMOS source followers to be approximately the same through the entire lower input signal range.

19 Claims, 4 Drawing Sheets

TEMPERATURE TOLERANT INPUT STAGES FOR CIRCUITS

FIELD OF DISCLOSURE

This disclosure relates generally to circuit input stages that are tolerant to negative-bias temperature instability (NBTI) and positive-bias temperature instability (PBTI), and more particularly to NBTI- and PBTI-tolerant circuit input stages with switched source followers.

BACKGROUND

PMOS (i.e., p-type metal-oxide-semiconductor field-effect) transistors, which are often used in input stages of amplifiers and analog comparators, are susceptible to NBTI and PBTI. In a rail-to-rail circuit input stage, PMOS transistors are used to detect the low side of the input common mode range, while NMOS (i.e., n-type metal-oxide-semiconductor field-effect) transistors are used to detect the high side of such range.

When a large differential input signal is applied to the low-side PMOS differential pair, one the PMOS transistors of that pair usually experiences a much larger source-to-gate voltage ($V_{SG}$) and gate-to-body voltage ($V_{GB}$) than the other PMOS transistor of the pair. This causes unbalanced NBTI and PBTI within the PMOS differential pair, which in turn, causes an unbalanced threshold voltage ($V_T$) shift within the pair. This manifests as an offset voltage of the input stage and of the amplifier or comparator. Too large of an input stage offset voltage causes the circuit's offset voltage to exceed the upper limit of the circuit's specification. Without mitigating NBTI and PBTI effects in rail-to-rail circuits that require a PMOS differential pair at the input, these circuits may experience a large increase in offset voltage.

Previous approaches to reducing the NBTI effect on an input stage PMOS differential pair include enlarging the width/length (W/L) ratio of each of the PMOS transistors, applying a small bias current, using low $V_T$ devices, and/or eliminating the body effect by connecting the bulk terminal to the source terminal in each PMOS transistor. Each of these adjustments individually may result in very small reduction in the NBTI effect. Applying all of these adjustments may reduce $V_{SG}$ to several hundred millivolts (mV) and reduce the $V_T$ shift to a few millivolts. However, connecting the bulk and source increases $V_{GB}$ and also increases the PBTI effect, which is not acceptable when both NBTI and PBTI effects need to be kept small.

The PBTI effect may be reduced by connecting the bulk terminal of each of the PMOS transistors to a supply voltage terminal. However, such configuration introduces a body effect and $V_{SG}$ may become large. Thus, NBTI and its effect on the offset voltage is significant.

Better solutions are thus desired. In this context, features and aspects of the present disclosure arise.

SUMMARY

In an example, a circuit comprises a high-side input stage and a low-side input stage. The high-side input stage includes differential signal inputs configured to receive first and second signals (e.g., VinP and VinN) respectively of a differential input signal (e.g., Vin). The low-side input stage comprises first and second differential input transistors each having a control terminal (e.g., M7 and M8); a first PMOS transistor having a gate (e.g., M3) configured to receive the first signal of the differential input signal, the first PMOS transistor having a source coupled to the control terminal of the first differential input transistor (e.g., M7); and a second PMOS transistor having a gate (e.g., M5) configured to receive the second signal of the differential input signal, the second PMOS transistor having a source coupled to the control terminal of the second differential input transistor (e.g., M8).

In an example, a circuit comprises a high-side input stage and a low-side input stage. The high-side input stage includes differential signal inputs configured to receive first and second voltage signals (e.g., VinP and VinN) respectively of a differential input voltage signal (e.g., Vin). The low-side input stage comprises first and second differential input transistors each having a control terminal (e.g., M27 and M28); a first PMOS transistor having a gate (e.g., M23) configured to receive the first voltage signal of the differential input voltage signal, the first PMOS transistor having a source coupled to the control terminal of the first differential input transistor (e.g., M27); a second PMOS transistor having a gate (e.g., M25) configured to receive the second voltage signal of the differential input voltage signal, the second PMOS transistor having a source coupled to the control terminal of the second differential input transistor (e.g., M28); a third PMOS transistor having a gate (e.g., M24) configured to receive the first voltage signal of the differential input voltage signal, the third PMOS transistor having a source and a bulk coupled together, the bulk of the third PMOS transistor also coupled to a bulk of the first PMOS transistor; and a fourth PMOS transistor having a gate (e.g., M26) configured to receive the second voltage signal of the differential input voltage signal, the fourth PMOS transistor having a source and a bulk coupled together, the bulk of the fourth PMOS transistor also coupled to a bulk of the second PMOS transistor.

In an example, a method comprises applying first and second signals (e.g., VinP and VinN) of a differential input signal (e.g., Vin) to first and second PMOS transistors (e.g., M3 and M5), respectively, of an input stage of a circuit; generating first and second bias currents for the first and second PMOS transistors using a current mirror of the input stage; generating a first level-shifted input signal (e.g., Vp) based on the first signal and a source-to-gate voltage of the first PMOS transistor; generating a second level-shifted input signal (e.g., Vn) based on the second signal and a source-to-gate voltage of the second PMOS transistor; and applying the first and second level-shifted input signals to a differential input component (e.g., M7 and M8) of the input stage.

In an example, a method comprises applying first and second voltage signals (e.g., VinP and VinN) of a differential input voltage signal (e.g., Vin) to first and second PMOS transistors (e.g., M23 and M25), respectively, of an input stage of a circuit; generating first and second bias currents and delivering the first and second bias currents to the source terminals of the first and second PMOS transistors, respectively; biasing first and second bulk node voltages (e.g., Vbp and Vbn) of the first and second PMOS transistors, respectively; generating a first level-shifted input voltage signal (e.g., Vp) at the source terminal of the first PMOS transistor based on the first voltage signal; generating a second level-shifted input voltage signal (e.g., Vn) at the source terminal of the second PMOS transistor based on the second voltage signal; and applying the first and second level-shifted input voltage signals to a differential input component (e.g., M27 and M28) of the input stage.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
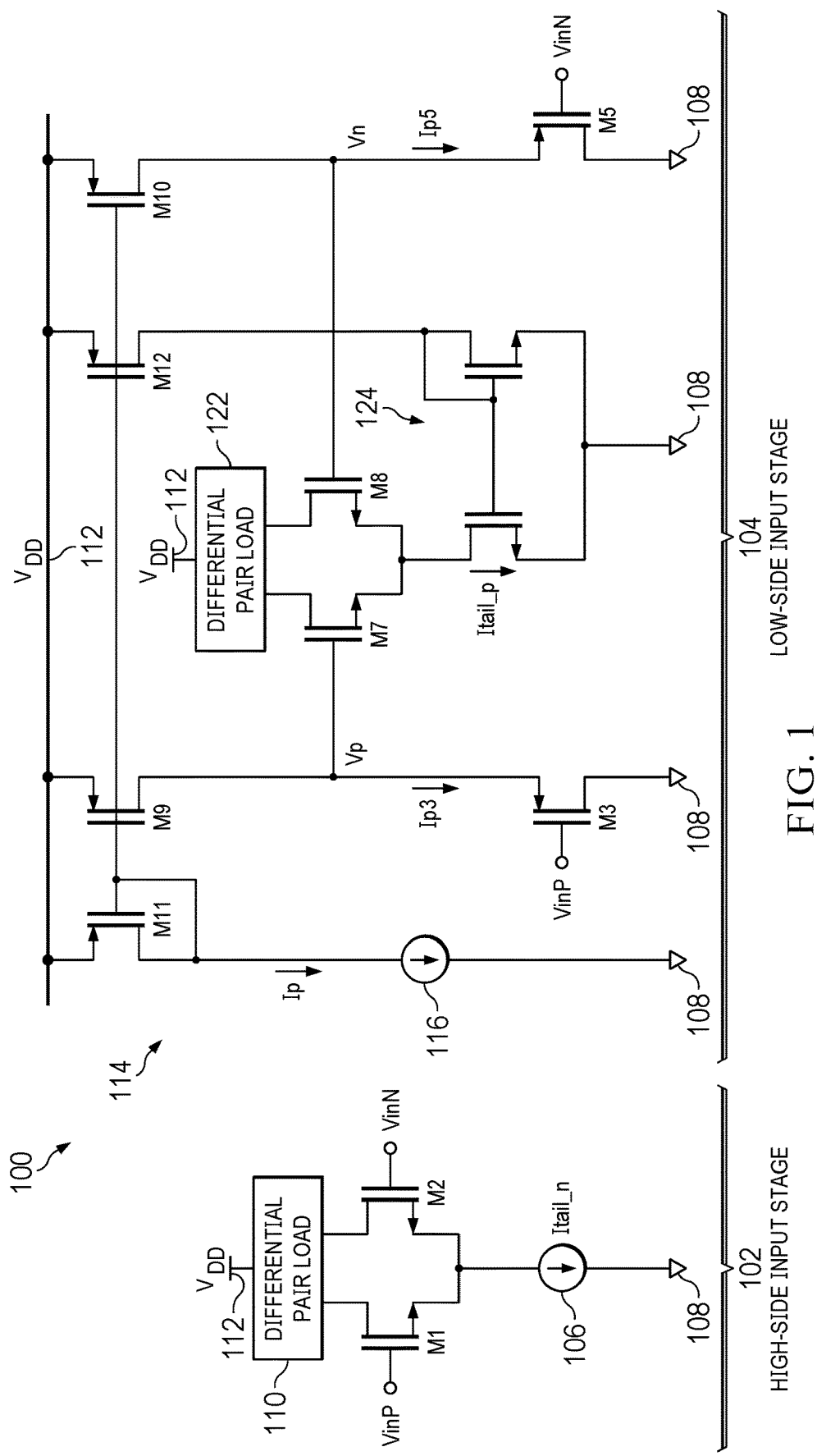
FIG. 1 is a circuit diagram of an example input stage of a rail-to-rail circuit.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, circuits, stages thereof, and methods use current-switched PMOS source follower transistors and a low-side NMOS differential pair to process a lower range of a rail-to-rail input signal range. A PMOS source follower is disposed between the positive input of the circuit (e.g., amplifier, comparator, etc.) and the positive input of the low-side NMOS differential pair. Another PMOS source follower is disposed between the negative input of the circuit and the negative input of the low-side NMOS differential pair.

The PMOS source followers act as voltage level shifters, allowing the low-side NMOS differential pair to operate in the lower side of the input range. Both PMOS source followers are biased with approximately the same amount of bias current which is dependent on both the positive and negative input signals, which may be monitored, to control the bias currents. By receiving approximately the same amount of bias current, the source-to-gate voltage ($V_{SG}$) of each of the PMOS source followers is kept approximately the same. The PMOS source followers and their bias currents are activated in the lower end of the input signal range in which a high-side NMOS differential pair is inoperable and deactivated in the higher end of the input signal range when the high-side NMOS differential pair is operable.

With this configuration, the NBTI effect on both PMOS source followers and thus the offset voltage of the circuit is not degraded. When either of the circuit inputs crosses into the high-side of the input range, the bias currents for both PMOS source followers are gradually switched off before either of the PMOS source followers runs out of operating headroom. This maintains the $V_{SG}$ of the PMOS source followers to be approximately the same through the switch-over, and as a result, the NBTI effects are cancelled. Thus, the bias currents of the two PMOS source followers are kept approximately the same through the entire input signal range. This results in cancelation, or substantial reduction, of NBTI effects, making the offset voltage free from the NBTI effect.

FIG. 1 is a circuit diagram of an example input stage 100 of a circuit such as an amplifier or comparator. Input stage 100 includes a high-side input stage 102 and a low-side input stage 104. Low-side input stage 104 is active when input signals VinP and VinN are in the low-side of the common mode input signal range, and high-side input stage 102 is active when either of the VinP and VinN of differential input signal Vin is the high-side of such range. Any suitable circuit may be employed to switch between low- and high-side input stages 102 and 104 at an appropriate cross-over voltage.

High-side input stage 102 includes a pair of input transistors M1 and M2. In an example, each of M1 and M2 is an n-type metal-oxide-silicon field-effect transistor (NMOS transistor), in which their gates are inputs for differential input signal Vin. A first signal (VinP) of Vin may be applied to the gate of M1, and a second signal (VinN) of Vin may be applied to the gate of M2. The sources of M1 and M2 are commonly coupled to a current source 106, which is also coupled to a ground terminal 108. Current source 106 generates a tail current denoted Itail_n. M1 and M2 may be actively loaded with a load 110 that is coupled to the drains of M1 and M2, where a high-side differential output signal is taken. Load 110 may also be coupled to a supply voltage terminal 112 to which a supply voltage $V_{DD}$ is delivered during operation. High-side input stage 102 is active at the high-side of the input common mode range, and thus processes the higher-side of the common-mode input signal range to generate the high-side differential output signal.

Low-side input stage 104 includes a current mirror structure 114, which in an example, is comprised of four p-type metal-oxide-silicon field-effect transistors (PMOS transistors) M9, M10, M11 and M12, as well as a current source 116. The sources of M9, M10, M11 and M12 are coupled to supply voltage terminal 112 and their gates are commonly coupled. The common gate node is also coupled to the drain of M11. Current source 116 is coupled between the drain of M11 and ground terminal 108. Current mirror structure 114 generates primary current Ip, as well as scaled versions Ip3 and Ip5, which are bias currents for source follower transistors M3 and M5, respectively. In an example, each of M3 and M5 is a PMOS transistor.

Each of M3 and M5 functions as a source follower, e.g., a PMOS source follower, when low-side input stage 104 is active (i.e., when both VinP and VinN are in the low-side of the input range). The sources of M3 and M5 are coupled to the drains of transistors M9 and M10, respectively, and the drains of M3 and M5 are coupled to ground terminal 108. The gates of M3 and M5 are inputs for VinP and VinN, respectively. Each of M3 and M5 receive approximately the same amount of bias current, which is a scaled current of Ip, when low-side input stage 204 is active. That is, the currents Ip3 and Ip5 are maintained to be approximately equal.

M3 and M5 level-shift their respective input signals. That is, when active, M3 level-shifts VinP to a voltage Vp, and M5 level-shifts VinN to a voltage Vn. These level-shifted voltages Vp and Vn are applied to the gates of NMOS transistors M7 and M8, respectively, which form a differential input pair of transistors for low-side input stage 104. M7 and M8 may be actively loaded with a load 122 that is coupled to the drains of M7 and M8, where a low-side differential output signal is taken. Load 122 is also coupled to supply voltage terminal 112. The sources of M7 and M8 are commonly coupled to a current mirror structure 124, which is also coupled to the drain of transistor M12 and to ground terminal 108. A tail current denoted Itail_p is mirrored from current Ip.

The configuration of FIG. 1 is best suited for a lower differential and common-mode input signal Vin. That is, provided that both VinP and VinN are low enough to avoid the headroom limitation of PMOS source followers M3 and M5, these transistors are substantially free of the NBTI effect. In an example, with VinP≈0 V, VinN≈5 V, width/length (W/L) of each of M3 and M5≈12 (20 µm/2 µm), Ip and Itail_p≈1 µA, and the temperature at approximately 125° C., the $\Delta V_t$ on M3 from NBTI was approximately 0.83 mV and the $\Delta V_t$ on M5 from PBTI was at or near zero.

Figure 2:
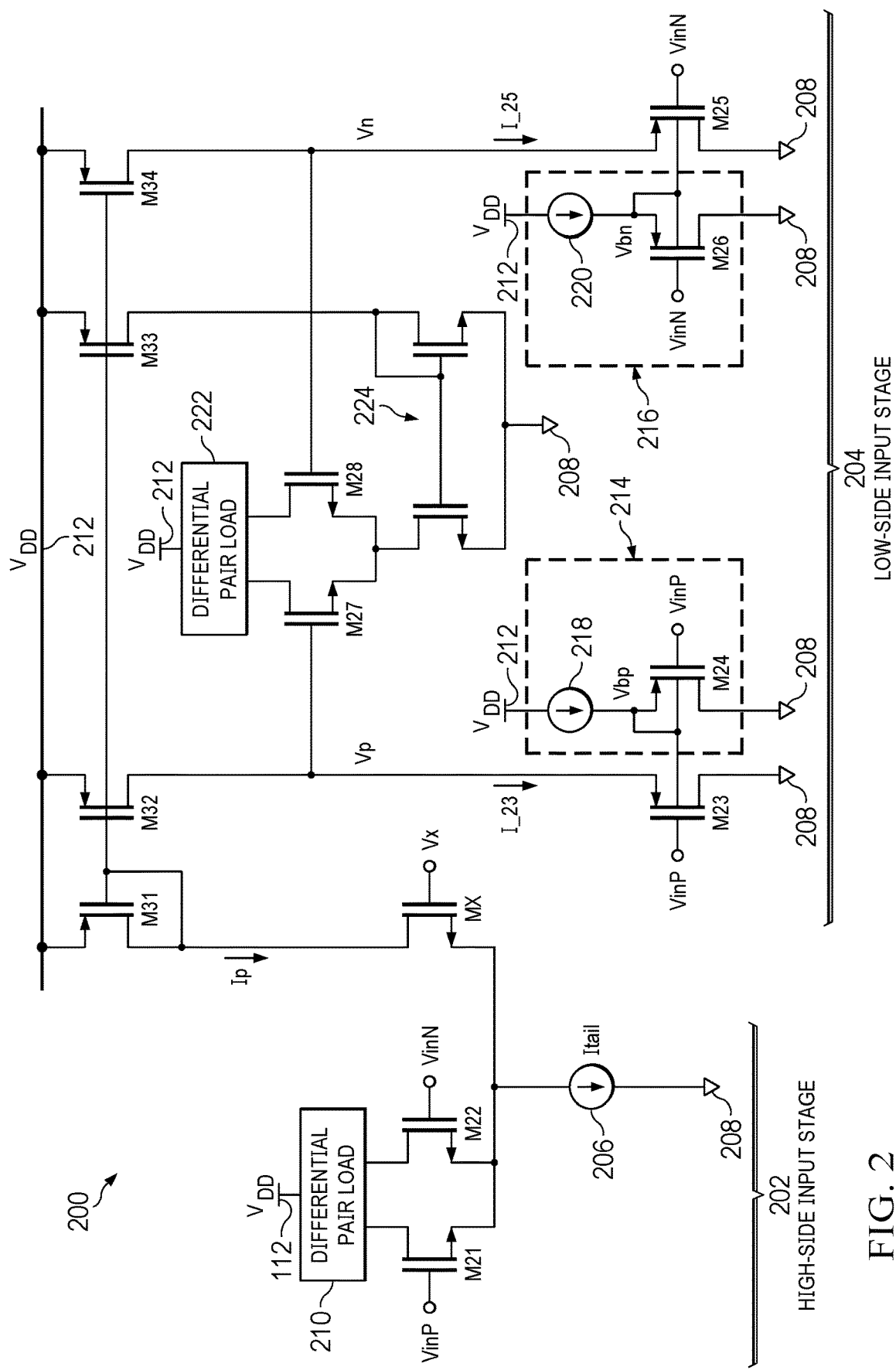
FIG. 2 is a circuit diagram of another example input stage of a rail-to-rail circuit.

FIG. 2 is a circuit diagram of an example input stage 200, which may be employed in various circuits including an amplifier and a comparator. Input stage 200 includes a high-side input stage 202 and a low-side input stage 204.

High-side input stage 202 includes a pair of input transistors M21 and M22. In an example, each of M21 and M22 is an NMOS transistor, in which their gates are inputs for a differential input signal (Vin). A first signal (VinP) of Vin may be applied to the gate of M21, and a second signal (VinN) of Vin may be applied to the gate of M22. The sources of M21 and M22 are commonly coupled to a current source 206, which is also coupled to a ground terminal 208. M21 and M22 may be actively loaded with a load 210 that is coupled to the drains of M21 and M22, as well as to a supply voltage terminal 212 to which a supply voltage $V_{DD}$ is delivered during operation. Current source 206 generates a current denoted Itail during operation of high-side input stage 202. A differential output signal of high-side input stage 202 is output at the drains of M21 and M22.

Input stage 200 may further include a switch MX, which may be in the form of an NMOS transistor. Transistor MX has a gate at which a cross-over voltage (Vx) is applied. The drain of transistor MX is coupled to a drain of transistor M31, and the source of MX is coupled to the sources of M21 and M22 and to current source 206. Vx separates the high-side and low-side of the common mode input signal range.

Transistor M31, which may be a PMOS transistor, is coupled to PMOS transistors M32, M33 and M34 in a current mirror configuration to mirror current Ip. That is, the gate and drain of M31 is coupled together, the gates of M31-M34 are commonly coupled, and the sources of M31-M34 are commonly coupled to supply voltage terminal 212.

The configuration of transistors M21, M22 and MX form an input range detection circuit to direct the current based on the value of the input signal compared to Vx. Thus, high-side input stage 202 processes the high side of the input common mode range, and low-side input stage 204 processes the low side of such range. When either VinP or VinN is greater than Vx, high-side input stage 202 is dominant, in which case tail current flows through M21 and M22. When both VinP and VinN are less than Vx, current is directed into low-side input stage 204 via the current mirror configuration form by M31-M34. Vx may be set to an appropriate value consistent with the teachings herein.

Low-side input stage 204 includes two PMOS transistors M23 and M25, each of which functions as a main source follower when low-side input stage 204 is active (i.e., when both VinP and VinN are in the low side of the input range). The sources of M23 and M25 are coupled to the drains of transistors M32 and M34, respectively, and the drains of M23 and M25 are coupled to ground terminal 208. The gates of M23 and M25 are inputs for VinP and VinN, respectively. Each of M23 and M25 receive approximately the same amount of bias current, which is a scaled current of Ip, when low-side input stage 204 is active. The bias currents for M23 and M25 are denoted I_23 and I_25, respectively.

Low-side input stage 204 also includes first and second auxiliary components 214 and 216 coupled to main source follower transistors M23 and M25, respectively. Auxiliary component 214 includes PMOS transistor M24 and current source 218 coupled between supply voltage terminal 212 and the source of M24. The source of M24 is coupled to its bulk which is also coupled to the bulk of M23. Auxiliary component 216 includes PMOS transistor M26 and current source 220 coupled between supply voltage terminal 212 and the source of M26. The source of M26 is coupled to its bulk which is also coupled to the bulk of M25. The gate of M24 is configured to receive the same signal (VinP) as the gate of M23, and the gate of M26 is configured to receive the same signal (VinN) as the gate of M25. The drains of M24 and M26 are coupled to ground terminal 208. Current sources 218 and 220 are each configured to deliver approximately the same amount of current.

With this configuration, M24 functions as an auxiliary source follower with respect to main source follower M23 to control its bulk voltage Vbp and to keep the source-to-gate voltage $V_{SG}$ of each of M23 and M24 approximately the same, and M26 functions as an auxiliary source follower with respect to main source follower M25 to control its bulk voltage Vbn and to keep the $V_{SG}$ of each such transistor approximately the same. In doing so, auxiliary source followers M24 and M26 prevent the output nodes of main source followers M23 and M25 from being pulled down toward ground potential when their bias currents are turned off.

In operation of low-side input stage 204, when VinP is applied to the gates of M23 and M24, the output of M23 is a level-shifted voltage of VinP. That level-shifted voltage is denoted Vp. Similarly, when VinN is applied to the gates of M25 and M26, the output of M25 is a level-shifted voltage of VinN, which level-shifted voltage is denoted Vn.

These level-shifted voltages Vp and Vn are applied to the gates of NMOS transistors M27 and M28, which form a differential input pair of transistors for low-side input stage 204. M27 and M28 may be actively loaded with a load 222 that is coupled to the drains of M27 and M28, where a low-side differential output signal is output. Load 222 is also coupled to supply voltage terminal 212. The sources of M27 and M28 are commonly coupled to a current mirror structure 224, which is also coupled to the drain of transistor M33 and to ground terminal 208.

Cross-over voltage Vx is preferably set low enough so that PMOS main source follower transistors M23 and M25 do not run out of headroom in the supply voltage ($V_{DD}$) direction. Moreover, the bias currents and source-to-gate voltages for M23 and M25 are kept approximately equal, regardless of the values of VinP and VinN. PMOS auxiliary source follower transistors M24 and M26 generate replica voltages of their respective PMOS main source follower transistors M23 and M25; and M24 and M26 are used to bias the bulk node voltages of M23 and M25, respectively, to avoid their output nodes (drains) from being pulled down toward ground when their bias currents are off.

With the configuration of FIG. 2, positive and negative low-side input signals are input to PMOS main source follower transistors M23 and M25, respectively, which transistors have bias currents that are approximately equal to each other and are controlled by the input voltages (VinP and VinN). By monitoring VinP and VinN, the bias currents are controlled and gradually reduced down to zero before M23 and M25 run out of operating headroom and thus become inoperable. The $V_{SG}$ of each of M23 and M25 is kept approximately the same during operation of low-side input stage 204, and thus the NBTI effect is equally present on both M23 and M25. Any $V_T$ shifts due to NBTI are substantially canceled, and the input offset voltage is substantially free of NBTI effects. In an example, with VinP≈0 V, VinN≈5 V, width/length (W/L) of each of M23 and M25≈12 (20 μm/2 μm), Ip and Itail≈1 μA, and the temperature at approximately 125° C., the $\Delta V_t$ on M23 from NBTI was approximately 0.1 mV and the $\Delta V_t$ on M25 from PBTI was at or near zero.

Figure 3:
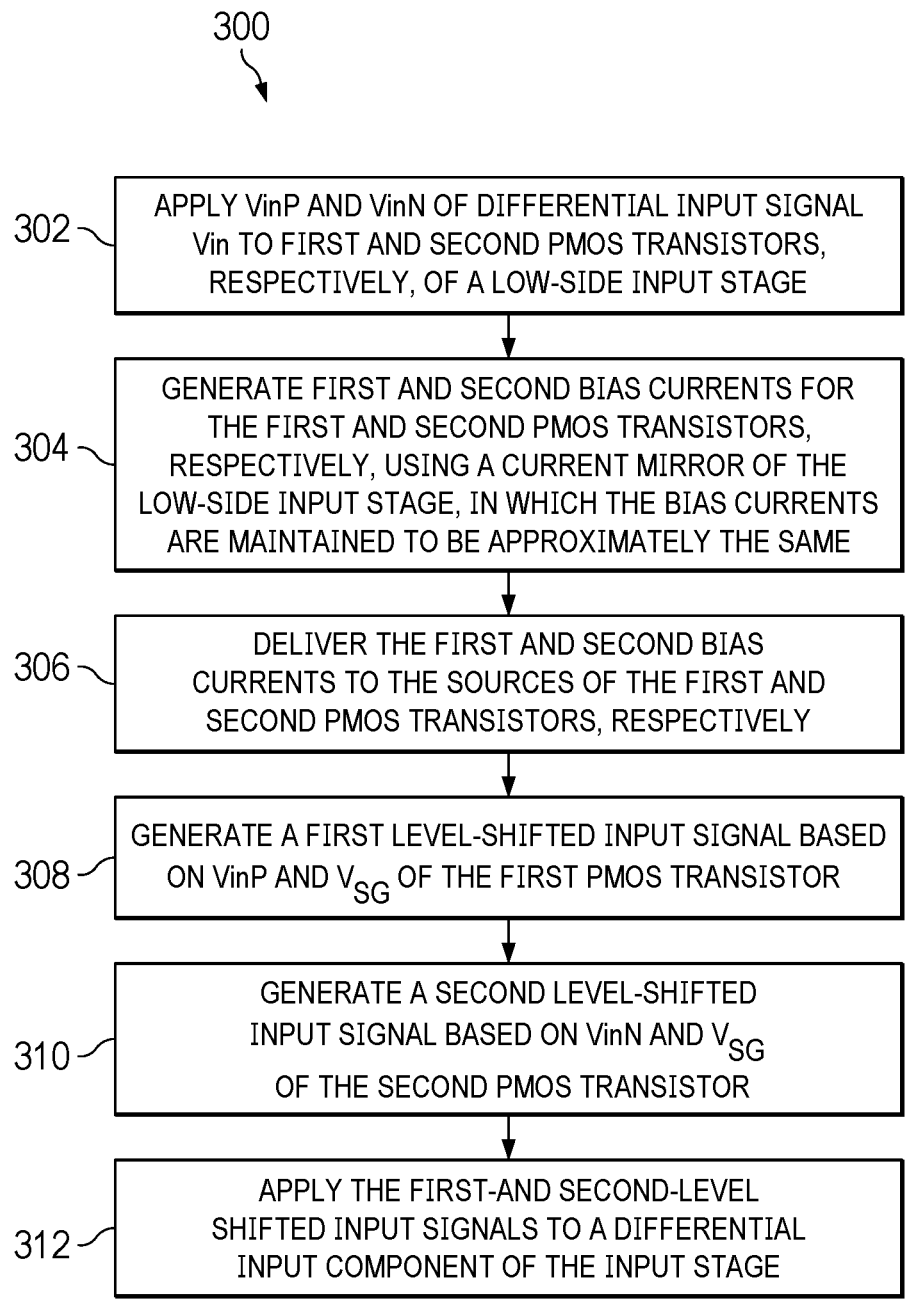
FIG. 3 is a flow diagram of an example method of operating an input stage of a rail-to-rail circuit, such as the input stage shown in FIG. 1.

FIG. 3 is a flow diagram of an example method 300 of operating an input stage of a rail-to-rail circuit, such as the input stage shown in FIG. 1. In operation 302, signals VinP and VinN of a differential input signal Vin are applied to first and second PMOS transistors, respectively, of a low-side input stage. These PMOS transistors may correspond to PMOS source follower transistors M3 and M5 of FIG. 1. In operation 304, first and second bias currents are generated for the first and second PMOS transistors, respectively. The bias currents are generated using a current mirror of the low-side input stage and are maintained to be approximately the same. The first and second bias currents are delivered to the first and second PMOS transistors, respectively, in operation 306.

With this operational configuration, first and second level-shifted voltages are generated. In operation 308, a first level-shifted input signal, e.g., voltage Vp, is generated based on VinP and $V_{SG}$ of the first PMOS transistor, e.g., M3, and in operation 310, a second level-shifted input signal, e.g., voltage Vn, is generated based on VinN and $V_{SG}$ of the second PMOS transistor, e.g., M5. In operation 312, the first and second level-shifted input signals are applied to a differential input component, e.g., NMOS differential input transistors M7 and M8.

Figure 4:
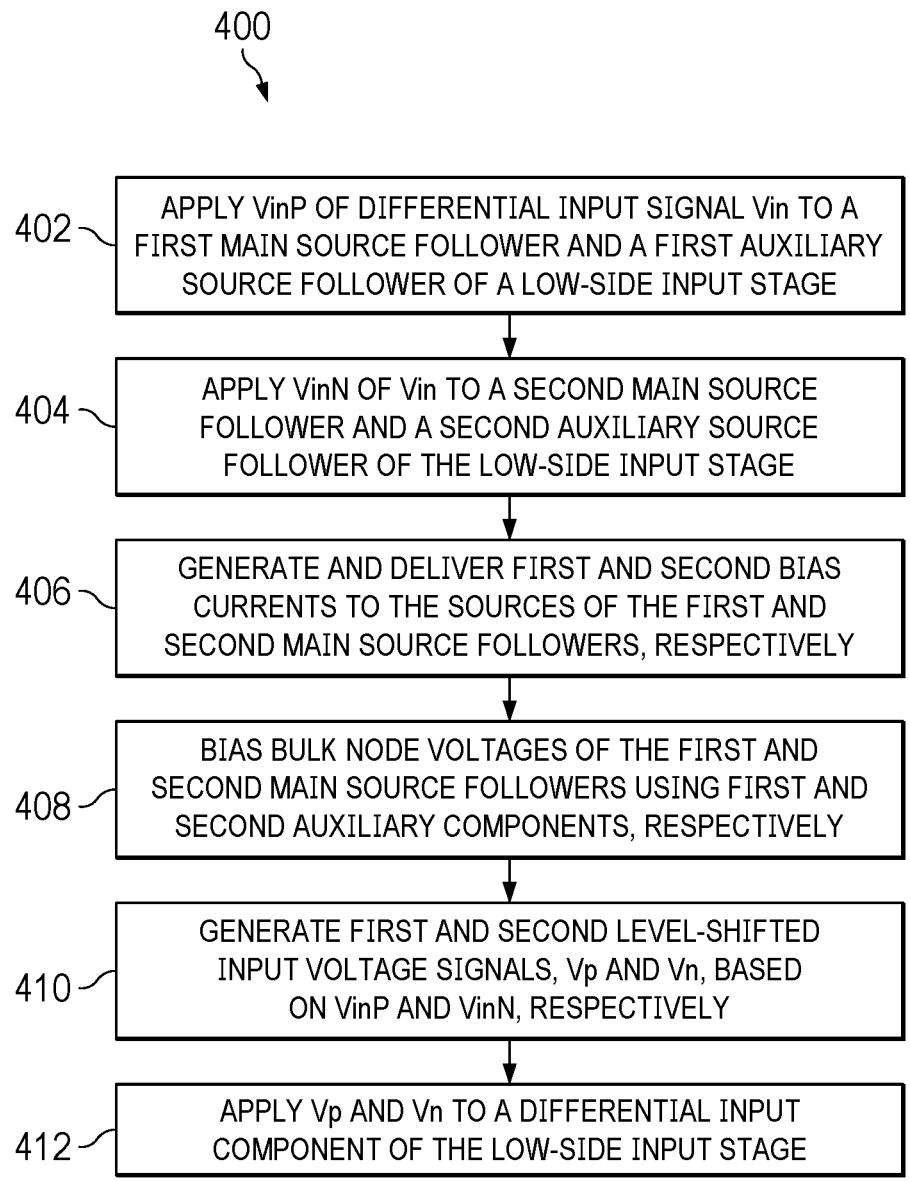
FIG. 4 is a flow diagram of another example method of operating an input stage of a rail-to-rail circuit, such as the input stage shown in FIG. 2.

FIG. 4 is a flow diagram of another example method 400 of operating an input stage of a rail-to-rail circuit, such as the input stage shown in FIG. 2. In operation 402, a first voltage signal, e.g., VinP, of a differential input signal, e.g., Vin, is applied to a first main PMOS source follower, e.g., M23, and to a first auxiliary PMOS source follower, e.g., M24, both of which form part of a low-side input stage. In operation 404, a second voltage signal, e.g., VinN, of Vin is applied to a second main PMOS source follower, e.g., M25, and to a second auxiliary PMOS source follower, e.g., M26, both of which are also part of the low-side input stage. In operation 406, first and second bias currents, e.g., I_23 and I_25, are generated and delivered to the sources of the first and second main source followers, respectively. The bulk node voltages of the first and second main source followers are biased in operation 408, using first and second auxiliary components, respectively. The first auxiliary component includes the first auxiliary PMOS source follower, and the second auxiliary component includes the second auxiliary PMOS source follower.

With this operational configuration, first and second level-shifted input signals, e.g., Vp and Vn, respectively, are generated in operation 410. The first level-shifted input signal is generated at the output (drain) of the first main PMOS source follower in response to VinP, and the second level-shifted input signal. In operation 412, the first and second level-shifted signals are applied to a differential input component of the low-side input stage.

Each of FIGS. 3 and 4 depicts one possible set and order of operations. Not all operations need necessarily be performed in the order described. Some operations may be combined into a single operation. One or more operations may be performed simultaneously or substantially simultaneously. Additional operations and/or alternative operations may be performed.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the term "terminal" means "node", "interconnection", "pin" and/or "lead". Unless specifically stated to the contrary, these terms generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, etc.), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of MOSFETs is described herein, other types of transistors (or equivalent devices) may be used instead. For example, instead of using n- and p-type MOSFETs, n- and p-type bipolar junction transistors (BJTs) may be used instead or in addition to MOSFETs in the various circuits described. Circuits described herein are reconfigurable to include the replaced components to provide functionality at least partially similar to functionality available prior to the component replacement.

Uses of the phrase "ground" in the foregoing description includes a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications of the described examples are possible, as are other examples, within the scope of the claims. Moreover, features described herein may be applied in other environments and applications consistent with the teachings provided.

What is claimed is:

1. A circuit comprising:
a high-side input stage including differential signal inputs configured to receive first and second signals respectively of a differential input signal; and
a low-side input stage comprising:
first and second differential input transistors each having a control terminal;
a first PMOS transistor having a gate configured to receive the first signal of the differential input signal, the first PMOS transistor having a source coupled to the control terminal of the first differential input transistor;
a second PMOS transistor having a gate configured to receive the second signal of the differential input signal, the second PMOS transistor having a source coupled to the control terminal of the second differential input transistor; and
a current mirror coupled to the sources of the first and second PMOS transistors.

2. The circuit of claim 1, wherein each of the first and second PMOS transistors is configured as a source follower.

3. The circuit of claim 1, wherein the control terminal of the first differential input transistor is configured to receive a first level-shifted input signal and the control terminal of the second differential input transistor is configured to receive a second level-shifted input signal.

4. The circuit of claim 3, wherein the first level-shifted input signal is level shifted relative to the first signal of the differential input signal, and the second level-shifted input signal is level shifted relative to the second signal of the differential input signal.

5. A circuit comprising:
a high-side input stage including differential signal inputs configured to receive first and second voltage signals respectively of a differential input voltage signal; and
a low-side input stage comprising:
first and second differential input transistors each having a control terminal;
a first PMOS transistor having a gate configured to receive the first voltage signal of the differential input voltage signal, the first PMOS transistor having a source coupled to the control terminal of the first differential input transistor;
a second PMOS transistor having a gate configured to receive the second voltage signal of the differential input voltage signal, the second PMOS transistor having a source coupled to the control terminal of the second differential input transistor;
a third PMOS transistor having a gate configured to receive the first voltage signal of the differential input voltage signal, the third PMOS transistor having a source and a bulk coupled together, the bulk of the third PMOS transistor also coupled to a bulk of the first PMOS transistor; and
a fourth PMOS transistor having a gate configured to receive the second voltage signal of the differential input voltage signal, the fourth PMOS transistor having a source and a bulk coupled together, the bulk of the fourth PMOS transistor also coupled to a bulk of the second PMOS transistor.

6. The circuit of claim 5, further comprising:
a switch coupled between the high-side input stage and the low-side input stage, the switch configured to receive a cross-over voltage to selectively activate the low-side input stage or the high-side input stage based on either of the first and second voltage signals and the cross-over voltage.

7. The circuit of claim 5, further comprising:
a first current source coupled to the source of the third PMOS transistor; and
a second current source coupled to the source of the fourth PMOS transistor.

8. The circuit of claim 5, wherein the control terminal of the first differential input transistor is configured to receive a first level-shifted voltage signal that is level shifted relative to the first voltage signal of the differential input voltage signal, and the control terminal of the second differential input transistor is configured to receive a second level-shifted voltage signal that is level shifted relative to the second voltage signal of the differential input voltage signal.

9. The circuit of claim 5, further comprising:
a current mirror coupled to the sources of the first and second PMOS transistors.

10. The circuit of claim 9, wherein the current mirror is configured to generate bias currents for the first and second PMOS transistors.

11. The circuit of claim 5, wherein each of the first and second PMOS transistors is configured as a main source follower, and each of the third and fourth PMOS transistors is configured as an auxiliary source follower.

12. The circuit of claim 5, further comprising:
an input range detection circuit including first and second high-side differential input transistors and a switch transistor coupled to the first and second high-side differential input transistors and the low-side input stage.

13. A method comprising:
applying first and second signals of a differential input signal to first and second PMOS transistors, respectively, of an input stage of a circuit;
generating first and second bias currents for the first and second PMOS transistors using a current mirror of the input stage;
generating a first level-shifted input signal based on the first signal and a source-to-gate voltage of the first PMOS transistor;
generating a second level-shifted input signal based on the second signal and a source-to-gate voltage of the second PMOS transistor; and
applying the first and second level-shifted input signals to a differential input component of the input stage.

14. The method of claim 13, wherein the first and second bias currents are generated and maintained to be approximately equal.

15. A method comprising:
applying first and second voltage signals of a differential input voltage signal to first and second PMOS transistors, respectively, of an input stage of a circuit;
generating first and second bias currents and delivering the first and second bias currents to first and second sources of the first and second PMOS transistors, respectively;
biasing first and second bulk node voltages of the first and second PMOS transistors, respectively;
generating a first level-shifted input voltage signal at the first source of the first PMOS transistor based on the first voltage signal;
generating a second level-shifted input voltage signal at the second source of the second PMOS transistor based on the second voltage signal; and applying the first and second level-shifted input voltage signals to a differential input component of the input stage.

16. The method of claim 15, further comprising:

delivering a first constant current to a source of third PMOS transistor having a bulk coupled to a bulk of the first PMOS transistor, the bulk and the source of the third PMOS transistor coupled together; and delivering a second constant current to a source of a fourth PMOS transistor having a bulk coupled to a bulk of the second PMOS transistor, the bulk and the source of the fourth PMOS transistor coupled together.

17. The method of claim 16, wherein the first and second constant currents are controlled to be approximately the same, and source-to-gate voltages of the first and second PMOS transistors, respectively, are approximately equal.

18. The method of claim 15, wherein the first and second bulk node voltages of the first and second PMOS transistors are biased using first and second auxiliary components, respectively.

19. The method of claim 16, further comprising:

applying the first and second voltage signals of the differential input voltage signal to the third and fourth PMOS transistors, respectively.

* * * * *